(12) United States Patent
Somerkoski

(10) Patent No.: US 8,626,254 B2
(45) Date of Patent: Jan. 7, 2014

(54) METAL ASSEMBLY CONSTITUTING A PRECURSOR FOR A SUPERCONDUCTOR, A SUPERCONDUCTOR AND A METHOD SUITABLE FOR THE PRODUCTION OF A SUPERCONDUCTOR

(75) Inventor: Jukka Somerkoski, Ulvila (FI)

(73) Assignee: Luvata Espoo Oy, Espoo (FI)

( * ) Notice: Subject to any disclaimer, the term of this patent is extended or adjusted under 35 U.S.C. 154(b) by 113 days.

(21) Appl. No.: 13/141,119

(22) PCT Filed: Dec. 22, 2009

(86) PCT No.: PCT/EP2009/067762
§ 371 (c)(1),
(2), (4) Date: Oct. 11, 2011

(87) PCT Pub. No.: WO2010/072771
PCT Pub. Date: Jul. 1, 2010

(65) Prior Publication Data
US 2012/0035059 A1    Feb. 9, 2012

(30) Foreign Application Priority Data

Dec. 23, 2008  (EP) .................................... 08172701

(51) Int. Cl.
*H01L 39/24*    (2006.01)

(52) U.S. Cl.
USPC .......................................... 505/232; 505/510

(58) Field of Classification Search
USPC .................. 505/230, 231, 232, 510, 430, 431
See application file for complete search history.

(56) References Cited

U.S. PATENT DOCUMENTS

| 4,665,611 A | 5/1987 | Sadakata et al. |
| 2002/0006527 A1 | 1/2002 | Kubo |

FOREIGN PATENT DOCUMENTS

| JP | 62211359 A | 9/1987 |
| JP | 2008166173 A | 7/2008 |

OTHER PUBLICATIONS

Pantsyrny et al.; Nb3Sn material development in Russia; Cryogenics, Elsevier, Kidlington, GB; Jul. 1, 2008; vol. 48, No. 7-8; pp. 354-370; XP022819649.
Kohno et al.; Ti Added Nb3Sn Wires by New Fabrication Processes; IEEE Transactions on Magnetics; Mar. 1987, vol. MAG-23, No. 2; pp. 964-967; XP002527032.

*Primary Examiner* — Colleen Dunn
(74) *Attorney, Agent, or Firm* — Hodgson Russ LLP (57) ABSTRACT

The invention relates to an assembly (1, 35, 71) of metal elements constituting a precursor for a superconductor. The assembly comprises at least one conductor element (5, 41, 73) adapted to provide a superconducting filament in the finished superconductor, and at least one doping element (7, 43, 75) providing a doping source for doping the conductor element. The invention also relates to a method suitable for producing a superconductor.

13 Claims, 4 Drawing Sheets

METAL ASSEMBLY CONSTITUTING A PRECURSOR FOR A SUPERCONDUCTOR, A SUPERCONDUCTOR AND A METHOD SUITABLE FOR THE PRODUCTION OF A SUPERCONDUCTOR

FIELD OF THE INVENTION

The present invention relates to a metal assembly constituting a precursor for a superconductor, which metal assembly comprises at least one conductor element and at least one doping element for doping the conductor element. The method also relates to a superconductor and method for producing a superconductor.

PRIOR ART

Low temperature superconductors, operating typically at 4.2 K are used for producing high magnetic fields in various magnetic applications such as in MRI and NMR apparatus, particle accelerators etc. One example of low temperature superconductors comprises Niobium alloyed with Titanium. Another preferred type comprises $Nb_3Sn$, possibly additionally alloyed with small quantities of Ta or Ti. Normally, a superconductor is formed from a plurality of filaments, having diameters in the range of up to ten micrometers, which are embedded in a metal, such as copper. The surrounding metal stabilizes the superconductor filaments mechanically and electrically.

One problem with for example $Nb_3Sn$ as a superconducting material is that the alloy is very brittle, making it difficult to shape the material to the required filament size. Similarly, the introduction of low amounts of the alloying elements Ti or Ta into the Nb-alloy, also work hardens the Nb-alloy so that filaments are difficult to form. When manufacturing $Nb_3Sn$ superconductors one has therefore first formed a metal assembly into a desired dimension and shape, such as a wire with embedded filaments, and then introduced Sn or other alloying elements into the Nb-filaments by diffusion annealing. The shape of the superconductor must be set prior to the diffusion annealing, after which the shape may no longer be changed due to its brittleness.

One method for producing a $Nb_3Sn$ superconductor comprises inserting an NbTi-rod inside a pure Nb-rod arranged inside a CuSn metal matrix. Both Nb and NbTi are soft materials and may be machined without difficulties. The arrangement is extruded, formed into a final desired shape, and is finally heated, so that Sn and Ti diffuses into the Nb-filaments to form the superconducting material, i.e. $Nb_3Sn$ alloyed with titanium. One drawback with this method is that it is expensive and time consuming to arrange the NbTi-rods inside the Nb-rods.

In the patent document WO 2005081 70 Nb and NbTi-rods are drawn and formed into hexagonal rods of the same size. The Nb- and NbTi-rods are positioned inside a copper matrix, and the NbTi-rods are uniformly spaced in the matrix. Due to their hexagonal shape the Nb and NbTi-rods may be packed close to each other. The number of Nb-rods far exceeds the number of NbTi-rods, since the desired content of Ti in the final superconducting material is low. The copper matrix is then drawn and formed into a hexagonal rod, and several such hexagonal rods are stacked inside a copper cylinder around an Sn-core. The copper cylinder is drawn to a final wire shape product, and is then diffusion treated to let the Ti and Sn diffuse into the Nb rods.

One problem with this solution is that, even though the NbTi-rods are uniformly arranged inside the metal matrix, so that the titanium spread uniformly throughout the wire, a small variation of the Ti-content arises, so that the niobium-tin superconductor becomes alloyed with different quantities of titanium at different locations. Since the sensitivity of the superconductor to variations in Ti-content is large, this leads to variations in the quality of the different superconductor filaments inside the wire, and decreased performance for the superconductor.

SUMMARY OF THE INVENTION

The object of the present invention is to facilitate the production of a high quality superconductor.

According to a first aspect of the invention this object is achieved with the metal assembly according to claim 1. According to a second aspect this object is achieved with a superconductor and according to a third aspect of the invention this object is achieved with a method according to claim 10.

By letting a metal assembly comprise at least as many doping elements arranged outside the conductor elements (which later will be formed into filaments), as the number of conductor elements, the doping substance contained in the doping element will be more homogeneously spread out throughout the superconductor after the diffusion heat treatment, which greatly improves the quality of the superconductor. The high quality means that a higher critical current may flow through the superconductor creating a higher magnetic field, or alternatively the magnet may be shaped into a more compact form. Since the doping elements are arranged outside the conductor elements the assembly of the elements is quick and accurate, which greatly improves the production rate for producing the superconductor. The new form of metal arrangement also involves lowered production cost.

The metal assembly comprises an assembly of elements or metal elements in order to form a precursor to a superconductor.

A true superconductor may then be formed from the metal assembly by diffusion annealing through heat-treatment. Preferably the metal assembly comprises a copper can in the form of a hollow copper cylinder, wherein the elements are arranged inside the copper can. The assembly may also comprise a metal matrix in which the rods are arranged.

An element of the assembly may comprise any suitable material, but preferably the elements are metal elements and preferably the material is soft so that the elements may easily be elongated. Preferably the elements are formed into rods or similar objects. A conductor element is an element intended to form a superconducting body, preferably a filament, in the finished superconductor. It is not necessary that the conductor element constitute a superconductor before finalization of the superconductor. The doping element may comprise one or more doping substances intended to dope or alloy the conductor element. The doping element may also comprise other substances, such as the same substances as the conductor element or that of a surrounding element. The doping substance may migrate into the conductor element by diffusion during a heat treatment.

A superconductor filament is a filament having practically zero electrical resistance at low temperatures. Typically in the art of low temperature superconductors operating temperatures are close to 4 K, being the helium boiling point at 1 atm. The diameter of the filaments may be between a few micrometers to several millimeters or more. Preferably the thickness of the filament is smaller than ten micrometers, since a thinner filament facilitates reaction to completion in a shorter time during heat treatment. Thin filaments also possess better AC-characteristics According to one embodiment, at least one doping element is positioned next to each conductor element for at least a majority of the conductor elements. Hence the doping elements are close to the conductor elements, so that the diffusion distance for the doping substance is short. Furthermore the amount of doping substance doping each conductor element may be more accurately controlled. Preferably at least two, more preferably at least three, and most preferably at least four, doping elements are positioned next to each conductor element. Hence each conductor element will receive the doping substance from several doping elements, which leads to a more uniform doping and decreases the risk for failure.

According to one embodiment, for at least a majority of the conductor elements, at least one doping element is positioned at a distance from each conductor element, which is less than or equal to the diameter of the conductor element. Preferably, for at least a majority of the conductor elements, at least one doping element is positioned at a distance from each conductor element, which is less than or equal to the distance to the closest neighbouring conductor element. Preferably for at least a majority of the conductor elements, at least one doping element is positioned in contact with each conductor element. Hence the risk that a conductor element will be positioned in the shadow of another conductor element relative to its closest doping element is decreased. Otherwise it may happen that, during a diffusion treatment, the doping substance from the doping element must travel through a conductor element to reach a conductor element behind it.

According to one embodiment at least two doping elements are positioned next to, and in two different directions of, each conductor element for at least a majority of the conductor elements. Hence, each conductor element becomes directly doped from two or more different directions. This will increase the homogeneity of the doping substance inside the conductor elements, and may also decrease the time to achieve the doping and diffusion. Preferably the doping elements are arranged in opposite directions of the conductor element. This would further increase the homogeneity of the doping substance. A doping element may be positioned next to two or more conductor elements, for example in between two doping elements, so that the doping element is shared between the conductor elements. The doping element then contributes to the doping of all of its surrounding conductor elements.

In one embodiment, at least three, preferably at least four, doping elements are positioned next to, and in three, or preferably four, different directions of each conductor element for at least a majority of the conductor elements. Hence the doping elements completely surround the conductor element. Preferably, the doping elements positioned next to each conductor elements are positioned substantially uniformly around the conductor element. Hence the homogeneity will increase further. One problem with the metal assembly is that the doping elements may crack at some points due to the severe elongation of the metal assembly and elements when shaping the metal assembly into its final shape. By providing several parallel doping elements the risk of complete failure at a section of the metal assembly will decrease.

According to one embodiment the assembly comprises a plurality of sleeve elements, each containing between one and seven conductor elements and its or their neighbouring doping element or elements. By providing such sleeve elements, the assembly of the metal assembly is facilitated. Since it is possible to arrange several elements into the metal assembly in one operation the time to finish the assembly is shortened. Preferably, the sleeve elements are also arranged to hold the elements together, and to ensure that the doping elements are close to the conductor. Preferably, the sleeve elements are arranged to each contain only one conductor element and its neighbouring doping element or elements, for at least a majority of the conductor elements. Preferably the sleeve elements comprise a high conductivity metal. Preferably the sleeve elements comprise Cu or a Cu-alloy. Thus the sleeve elements provide a high conductivity metal into which the superconductor filaments are embedded for mechanical and electrical stability.

According to one embodiment the sleeve elements have a wall defining an inner hollow, and at least a majority of the doping elements are positioned in between the conductor elements inside the hollow and the cylinder wall. Hence the doping substance is walled in by the sleeve element so that the doping substance tends to diffuse into the conductor element. In particular, the solubility of Ti in Cu is lower than in Nb, wherein the Ti mainly diffuses into the Nb-filaments.

According to one embodiment the assembly comprises at least two doping elements positioned outside the conductor element for each conductor element. Preferably, for at least a majority of the conductor elements, the assembly comprises at least three, preferably at least four, doping elements for each conductor element. By arranging several doping elements for each conductor element, the uniformity of the distribution of the doping substance is increased, which in turn increases the quality of the superconductor.

According to one embodiment at least a majority of the conductor elements and doping elements have an elongated shape with a uniform cross-section. Preferably the metal assembly itself has an elongate shape with a uniform cross-section. An element with an elongated shape and a uniform cross-section is simple to form into new shapes. Hence it is easy to further elongate the conductor and doping elements into superconductor filaments and the metal assembly into a superconductor wire. In one preferred embodiment the doping elements and the conductor elements are shaped as rods, preferably with circular or hexagonal cross sections. Depending on how far the manufacturing has progressed the rods may have different dimensions.

Preferably, the cross-sectional area of each of at least a majority of the doping elements is smaller than one fifth of the cross-sectional area of each of at least a majority of the conductor elements. Preferably the cross-sectional area of the doping elements is smaller than one tenth of the cross-sectional area of the conductor elements, more preferably, the cross-sectional area of the doping elements is smaller than one hundredth of the cross-sectional area of the conductor elements. The desired doping substance content, which in most cases is very low, determines the number and sizes of the doping elements. By having a smaller cross-section for the doping elements a larger number of doping elements may be arranged into the metal assembly, giving a better homogeneity. It is also possible to arrange the doping elements more uniformly throughout the metal assembly. In one embodiment the doping elements are arranged in gaps formed between neighbouring conductor elements, providing mechanical stability and close packing of the assembly.

According to one embodiment at least a majority of the conductor elements contain niobium or a niobium alloy such as Nb—Ta or Nb—Zr. Preferably the doping element contains a doping substance selected from the group consisting of Ti, Hf or Zr. Preferably at least a majority of the doping elements comprise titanium as doping substance. Doping with titanium gives superconductors with very good performance. Preferably the doping element comprises NbTi, with a Ti content between 20-60% by weight. Preferably the doping element comprises 40-50% by weight Ti, which is commercially available. Thus the ratio between Nb and Ti is about 1:1, and residual impurities in the ordinary amount. NbTi-alloys with these given ranges of Ti are more ductile and more readily deformable to high strains than Nb-alloys with other Ti-contents. Hence a doping element comprising NbTi will easily be processed into a desired final shape. Furthermore, the Nb in the doping element may migrate into the conductor element and become a part of the conductor element during diffusion, since the solubility of Nb in Cu is low.

According to one embodiment at least a majority of the doping elements comprises a doping core containing the doping substance, and a diffusion-blocking layer enclosing the doping core for blocking diffusion of the doping substance through the diffusion-blocking layer at temperatures below a desired diffusion temperature. Preferably, the diffusion temperature, above which diffusion takes place through the diffusion-blocking layer, is in the range between 500-1000° C. The doping substance, in particular Ti, may diffuse into the surrounding metal, in particular into Cu, at typical hot working temperatures of the art. Diffusion and resulting reactions between copper and titanium may form hard intermetallic particles on the surface of the conductor elements. Such particles may have dimensions of same size as the diameter of the desired superconductor filaments, wherein the filaments may be disrupted during metal working steps to final dimensions. Therefore, it is advantageous to block diffusion of the doping substance into the surrounding metal to retain the formability of the metal assembly. Preferably the diffusion-blocking layer comprises pure Nb to a content of at least 95% by weight. The diffusion-blocking layer may be a sleeve arranged outside the doping core, a coating arranged on the doping core, or a layer with a different elemental content arranged around the doping core.

According to one embodiment at least a majority of the conductor elements each comprises a conductor core adapted to form the superconductor filaments. The conductor core contains the main component, or substance, constituting the material of the finished superconductor. In one embodiment the conductor core contains Nb, and possible impurities. In another embodiment, the conductor core is niobium tantalum alloy. In another embodiment, the conductor core is niobium zirconium alloy. Preferably, at least a majority of the conductor elements further comprises a supporting element containing a metal with high electric conductivity, arranged around the core. The supporting element is adapted to embed and stabilize the superconducting filament in the finished superconductor and facilitate metal forming of the conductor elements.

According to one embodiment the invention comprises producing the doping and conductor elements by elongating a material blank of the respective materials into respective doping and conductor elements having substantially uniform cross-sections. In one embodiment the invention comprises drawing the material blanks into elongated doping and conductor elements. In another preferred embodiment the invention comprises extruding the material blanks into elongated doping and conductor elements.

In one embodiment the doping elements are before being assembled into the metal assembly together with the conductor elements. In a further embodiment the already elongated doping elements and the conductor elements are jointly elongated in an additional elongating step. Hence the doping elements are elongated at least one more time than the conductor elements, so that the doping elements obtain a smaller cross-sectional area than the conductor elements. Hence the amount of doping substance will correspond to a desired doping level inside the finished superconductor filament.

In one embodiment the invention comprises annealing an element, which is to be a part of the metal assembly, after elongation of the element. By annealing the element any cold work hardening in the element may be alleviated, so that further forming or elongation will be facilitated.

According to one embodiment the metal assembly is compacted. Preferably, the metal assembly is compacted before shaping the metal assembly into its final desired shape. By compacting the metal assembly any unfilled spaces in the metal assembly will shrink and be removed. Hence, the assembly will form a close-packed superconductor even if there are empty spaces inside the metal assembly during earlier manufacturing steps, allowing a far wider number of allowable configurations of the elements. Preferably the metal assembly is compacted by an isostatic pressing treatment. Preferably the metal assembly is compacted by a method selected from the group comprising Hot Isostatic Pressing or HIP-treatment, Cold Isostatic Pressing or CIP-treatment and Warm Isostatic Pressing or WIP-treatment. Most preferably the metal assembly is compacted by HIP-treatment.

Preferably a tin supply element comprising an Sn-source is arranged into the metal assembly. Preferably the invention also comprises compacting the metal assembly before the arrangement of the Sn-source into the metal assembly. Preferably the invention also comprises performing any hot working steps, apart from the diffusion annealing, before arranging the Sn-source into the metal assembly. Thus, the method according to the invention predominantly comprises cold working steps after arrangement of the Sn-source into the metal assembly. Preferably the Sn-source is provided at the stage allowing cold working directly to final dimension before a final diffusion heat treatment. Tin has a very low melting point and diffuses easily. Also, the Sn-alloys created during diffusion are mostly brittle and difficult to form into a desired shape. Hence it is advantageous to add the tin as late as possible, so that the other metals may be treated at higher temperatures. Preferably the tin supply element comprises pure tin. Since tin has a low melting point in relation to other metals, an alloying metal in an alloy with tin may precipitate due to its higher melting point. In another embodiment, Sn supply comprises tin alloyed with low content of for example copper allowing high cold working degrees.

According to one embodiment of the invention a superconductor is manufactured by diffusion heat treatment of a metal assembly according to any of the embodiments above. The diffusion heat treatment to form $Nb_3Sn$ is preferably performed in a diffusion temperature in the range between 500-1000° C., more preferably in the range 600-800° C., most preferably in the range between 620-750° C., for in between 50 to 400 hours. Due to low melting point of tin source, it is advantageous to rise the temperature stepwise in intervals such as annealing at temperature range of 200-215° C. for 30-60 hours, then at 390-410° C. for 30-60 hours and at 550-570° C. for 30-60 hours following the actual $Nb_3Sn$ formation heat treatment.

In one embodiment tin from the tin supply element diffuses into a niobium conductor element to form the superconducting material $Nb_3Sn$ during the diffusion step. Furthermore, Ti from a NbTi doping source diffuses into the niobium conductor elements for doping the $Nb_3Sn$ with titanium. Other kinds of superconductors may be formed in a similar manner. The reason for performing the diffusion heat treatment in a final step is because the Nb$_3$Sn is very brittle and difficult to form into a desired shape.

BRIEF DESCRIPTION OF THE DRAWINGS

The invention is now to be described as a number of non-limiting examples of the invention with reference to the attached drawings.

DETAILED DESCRIPTION OF PREFERRED EMBODIMENTS

Figure 1A:
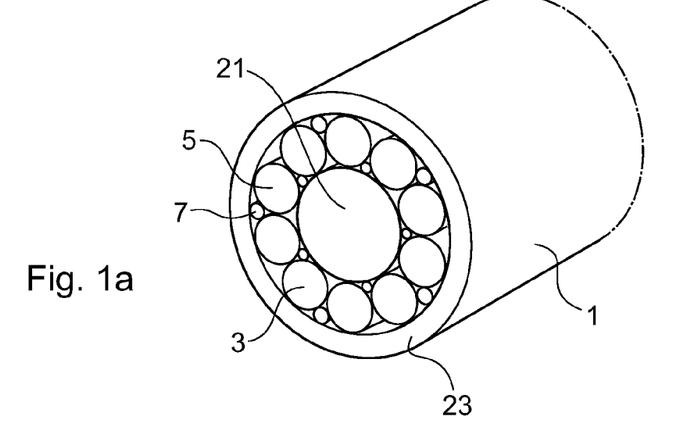
FIG. 1a-d show a first example of a metal assembly and method for production of a superconductor according to the invention.

In FIG. 1a one example of a metal assembly 1 of elements 3 constituting a precursor for a superconductor according to the invention is shown. The metal assembly 1 comprises a plurality of conductor elements 5 adapted to provide superconducting filaments in the finished superconductor, and a plurality of doping elements 7 providing a doping source for doping the conductor elements 5. One example of a conductor element 5 is shown in greater detail in FIG. 1b, and one example of a doping element 7 is shown in FIG. 1c.

According to the invention the assembly 1 comprises at least as many doping elements 7 arranged outside the conductor elements 5, as the number of conductor elements 5. In this example at least one doping element 7 is positioned next to each conductor element 5. After a diffusion heat treatment the doping substance contained in the doping elements 7 will therefore be more homogeneously spread out throughout the superconductor, which greatly improves the quality of the superconductor.

The doping elements 7 are arranged next to and close to, in this example in contact with, the conductor elements 5. Hence the doping element next to each conductor element is at least as close to the conductor element as the closest other conductor element. Hence the diffusion distance for the doping substance is short. The conductor and doping elements 5, 7 do however constitute separate elements until the finishing diffusion step, which is described below.

In this example, since the size of the doping elements 7 is much smaller than the size of the conductor elements 5, the doping elements are arranged in the unfilled spaces formed between the conductor elements 5. In this example only one layer of conductor elements 5 is shown for the sake of simplicity, but in practice any number of layers of conductor elements may be used. Furthermore, two doping elements 7 are arranged close to each conductor element 5. In this example each doping element is shared between two conductor elements 5, and the two doping elements 7 positioned next to each conductor element 5 are positioned in substantially opposite directions of the conductor element 5. Hence the concentration of the doping substance after diffusion will be more homogenous.

In this example at least a majority of both the conductor elements 5 and doping elements 7 have an elongated shape, so that their lengths are longer than their widths and heights. The conductor elements 5 and doping elements 7 are further shaped with a uniform cross-section for their entire lengths. In this example the conductor elements 5 and doping elements are 7 cylindrical rods shaped with a circular cross section. For at least a majority of the doping and conductor elements, the cross-sectional area of each doping element is smaller than one fifth of the cross-sectional area of each conductor element. Other shapes of conductor and doping elements may be used such hexagonal or trapezoidal shapes to increase the filling factor of the assembly.

Figure 1B:
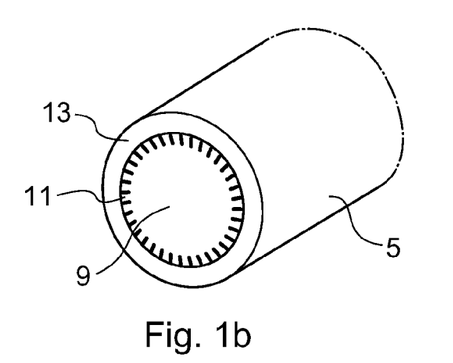
Figure 1C:
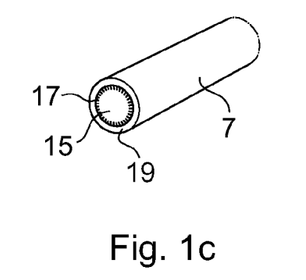

In FIG. 1b the conductor element is shown in greater detail. The conductor element 5 comprises a conductor core 9 containing a superconductor base material and being adapted to constitute the superconductor filament in the finished superconductor. In this example the conductor core 9 comprises Nb or an Nb alloy such as NbTa or NbZr. Preferably the conductor core 9 comprises pure Nb, apart from impurities, since pure Nb is ductile and easily to be formed into thin filaments. The conductor element 5 further comprises a conductor element casing 13 arranged around the core 9. The casing 13 is in this example made in Cu or a Cu alloy.

In an embodiment of the invention the conductor element 5 further comprises a diffusion-blocking layer 11 arranged around the conductor core 9. The diffusion-blocking layer 11 is needed when using bigger conductor element that are surrounded by pure NbTi rods.

In FIG. 1c a doping element 7 is shown in greater detail. The doping element 7 comprises a doping core 15 containing the doping substance. The doping element 7 is further provided with a diffusion-blocking layer 17 enclosing the doping core 15 and adapted to block diffusion of the doping substance at temperatures below a desired diffusion temperature. The doping element also comprises a doping element casing 19 arranged around the core and the diffusion layer 17, which casing 19 in this example is made in Cu or a Cu-alloy.

The doping substance, in this example the doping core 15, comprises a NbTi alloy for doping the conductor element with Ti. This alloy is ductile and can easily be formed into the desired shape of the doping element. The number and size of the doping elements 7 is chosen so that the finished superconductor filaments contain between 0.2-3% by weight Ti, preferably between 0.5-1.5% Ti.

The diffusion-blocking layer 17 is in this example made of a layer of pure Nb around the NbTi core. Diffusion of Ti must be hindered during the production of the assembly, since the Ti may otherwise diffuse into the surrounding Cu-casing or supporting element, resulting in formation of Cu—Ti intermetallics and possible adverse breakages of the desired thin filaments. The diffusion-blocking layer 17 is adapted to block diffusion at temperatures lower than a desired diffusion temperature.

The assembly further comprises an Sn-source 21 arranged for providing Sn to the superconductor filaments. The Sn-source comprises a cylindrical rod of pure Sn or an Sn-alloy with Cu. The Sn-source is adapted to have a size and content of Sn, so that after diffusion the finished superconductor filaments will be constituted of Nb$_3$Sn doped with Ti.

The metal assembly 1 further comprises a supporting element adapted to hold the assembly together. The supporting element comprises a hollow cylinder, wherein the conductor 5 and doping elements 7 are arranged inside the cylinder, together with the Sn-source 21, which is arranged in the center of the assembly. In this example the surrounding supporting element 23 is made in a Cu or a Cu-alloy, since it is advantageous that the finished superconductor filaments are embedded in copper for both electrical and mechanical stability. Preferably the supporting element 23 is made in the same material as the conductor and doping element casings 13, 19.

Figure 1D:
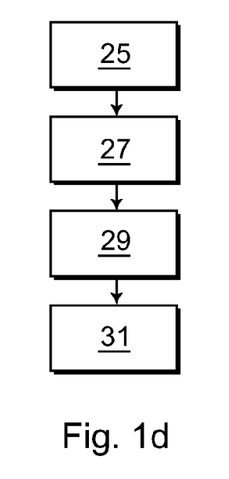

In the following one example of a method suitable for producing a superconductor from the metal assembly in FIG. 1a is described. The exemplary method is depicted in FIG. 1d.

In a first step 25, the method comprises producing at least one conductor element 5. The conductor element is produced from a blank of the appropriate material by elongating the blank into a rod-like conductor element 5. The elongation may be carried out by any elongation procedure, such as extrusion, drawing, or even rolling, depending on the desired geometry of the conductor element. Similarly, the method comprises producing at least one doping element 7 by elongating a material blank of the appropriate material. In this example the method comprising elongating the doping elements so that the doping elements obtain a cross-sectional area which is smaller than one fifth of the cross-sectional area of the conductor elements. This may be carried out by using a more severe elongation procedure for the doping element than for the conductor element, or by elongating the doping elements additional times in relation to the conductor elements.

In a second step 27, the method comprises assembling at least one conductor element and at least one doping element 7 into the metal assembly 1, which is a precursor for a superconductor. In particular the method comprises assembling at least one doping element for each conductor element into the metal assembly, and arranging the doping elements outside the conductor elements. The method further comprises positioning at least one, in this example at least two, doping elements 7 next to each conductor element 5 at a distance, which is smaller than the diameter of the conductor element. In this example the doping elements are positioned to be in contact with the conductor elements. The method also comprises arranging at least two doping elements next to, and in two different directions of, each conductor element, so that the doping elements are arranged substantially uniformly around each conductor element.

In the second step the method also comprises arranging a Sn-source 21 in the assembly, in this example in the center of the assembly. The method also comprises arranging the conductor elements, the doping elements and the Sn-source inside a supporting element 23, in this example made of Cu or a Cu-alloy. Such a supporting element is in some instances in the art referred to as a tube or a can.

In a third step 29, the method comprising forming the assembly into a desired shape. In this example the method comprises elongating the metal assembly into a thickness desired for the finished superconductor. The elongation may comprise drawing, or any other suitable cold working process, and may be performed in one or several steps. Furthermore, the method may comprise assembling several such metal assemblies 1 into an even larger assembly, which is then elongated correspondingly. Preferably the final assembly is elongated to a diameter of between 1 to 10 mm, and so that the superconductor filaments obtain a diameter of a few to a few tens of micrometers.

In a fourth step 31, the method comprises diffusion heat treating the metal assembly. The heat treatment is in this example carried out at a temperature between 600-800° C., and for between 100 to 400 hours. During the heat treatment the doping substance from the doping elements diffuses into the conductor elements, and the Sn from the Sn-source diffuses into the conductor elements. In this example $Nb_3Sn$ superconductor filaments doped with between 0.2-3% Ti, preferably doped with 0.5-1.5% Ti, are formed during the diffusion. After the diffusion step the finished superconductor can no longer be changed into other shapes due to the brittleness of the $Nb_3Sn$.

Figure 2A:
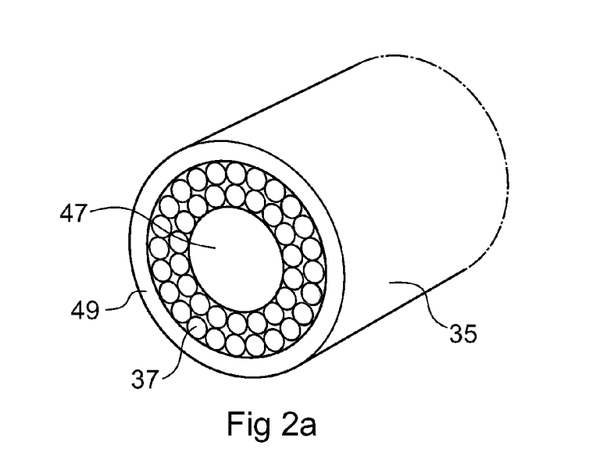
FIG. 2a-d show a second example of a metal assembly and a method for production of a superconductor according to the invention.

In FIG. 2a a second example of an assembly 35 according to the invention is shown. In difference to the assembly in FIG. 1a the assembly in FIG. 2a comprises a plurality of sub-assemblies 37. Each subassembly 37, an example of which is shown in greater detail in FIG. 2b, comprises a sleeve element 39, at least one conductor element 41, and at least one doping element 43 (same as doping element 7 in FIG. 1c) arranged outside the conductor element. In another example the subassembly may instead be designed in the same manner as the assembly in FIG. 1a, or be designed in some other suitable way.

Figure 2B:
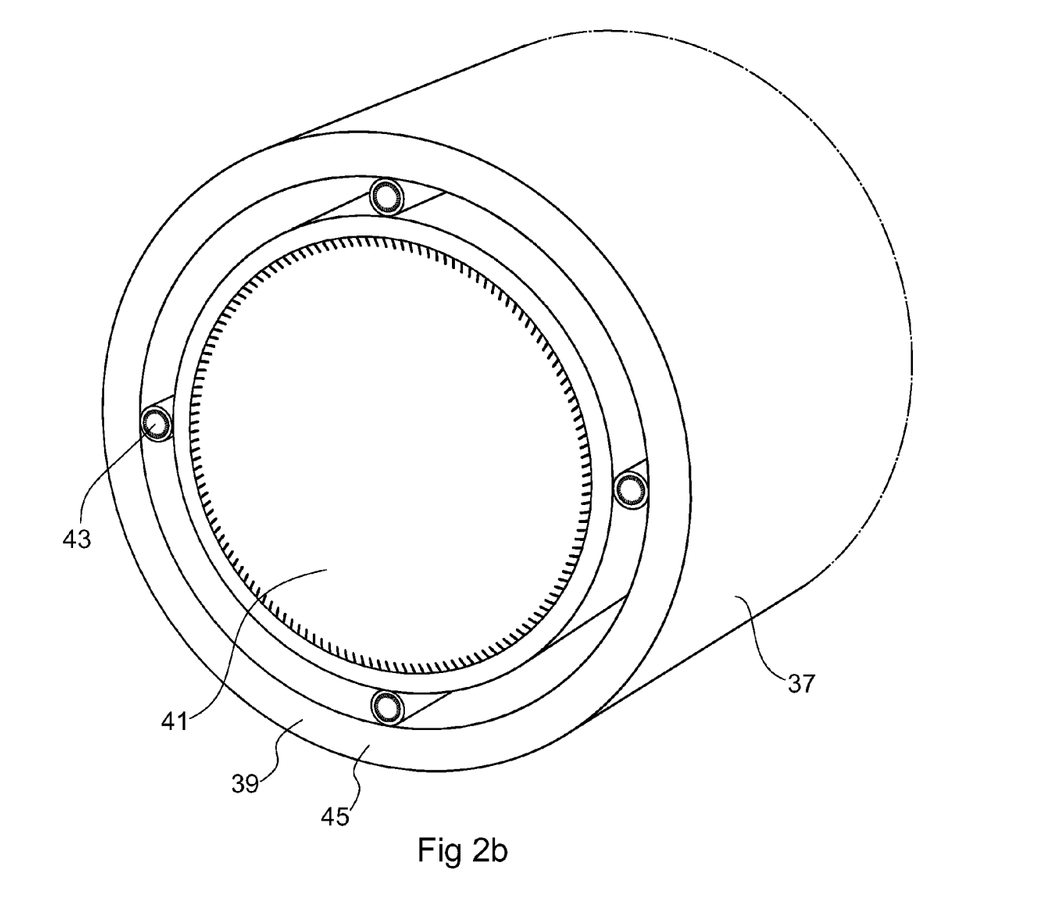
Figure 2C:
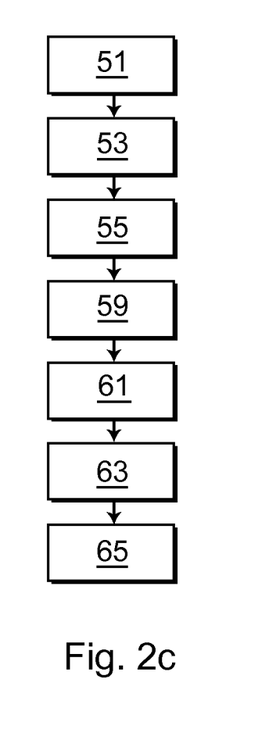
Figure 2D:
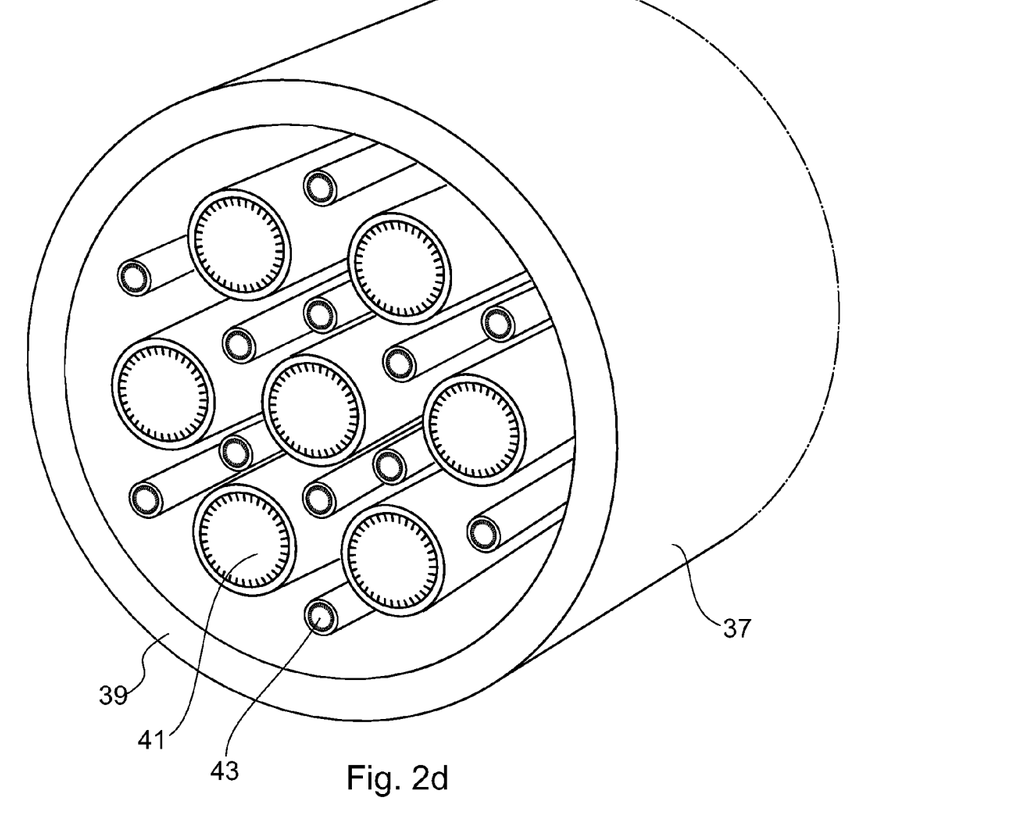

The sleeve element 39 is hollow in order to allow arranging the conductor element 41 and doping elements 43 inside the sleeve element 39. In this example only one conductor element is arranged inside the sleeve element, but in another example up to seven conductor elements may be arranged inside the same subassembly, see FIG. 2d. The subassembly 37 further comprises at least one doping element, in this example four doping elements 43, arranged inside the sleeve element but outside and next to the conductor element. Hence the sleeve element 39 is arranged to contain one conductor element 41 and its neighbouring doping element 43 or elements. In another example each subassembly 37 may instead contain between one and seven conductor elements and its or their neighbouring doping element or elements arranged inside a sleeve element 39. In FIG. 2d seven conductor elements 41 has been arranged so that a central conductor elements 41 is surrounded symmetrical by six conductor elements 41. Doping elements 43 have been positioned around the conductor elements 41. A symmetrical position of the conductor elements 41 and the doping elements 43 improves the quality of the produced superconductor.

The sleeve element 39 is arranged to support, surround and hold the conductor elements 41 and doping elements 43 together. In this example the sleeve element is made in a metal with high conductivity, in this example in Cu or a Cu-alloy. The metal of the sleeve element 39 will hence embed and stabilize the filaments formed from the conductor elements in the finished superconductor. In this example all conductor and doping elements are arranged inside a sleeve element, but in another example it may be sufficient that at least a majority of the conductor elements are arranged inside a sleeve element.

The doping elements 43 are arranged next to the conductor element, and are positioned in at least two, in this example four, different directions of the conductor element 41. The doping elements are further arranged uniformly around the conductor element, wherein the doping substance will more homogenously diffuse into the conductor element. Furthermore, the doping elements are positioned at a distance from the conductor element, which is less than or equal to the diameter of the conductor element, in this example in direct contact with the conductor element.

In this example the sleeve elements 39 have walls 45 defining said inner hollow. At least a majority of the doping elements are positioned inside the hollow between the conductor elements and the walls 45 of the cylinders. In this example the conductor element is positioned in between the doping elements 43 within the sleeve element. Hence the doping elements are positioned in a space between the conductor element and the wall of the sleeve.

In accordance with the assembly in FIGS. 1a-c the conductor elements 41 and doping elements 43 have an elongated shape with a uniform cross-section. In this example the conductor and doping elements are rod shaped. Similarly the sleeve element 39 is elongated with a uniform cross-section, and is in this example shaped as a hollow cylinder. The cross-sectional area of each of at least a majority of the doping elements is furthermore smaller than one fifth of the cross-sectional area of each of at least a majority of the conductor elements. In one example, the diameter of the conductor element in the subassembly is between 12-17 cm, in this example 15 cm, and the diameter of the doping elements are between 3-15 mm, in this example 5 mm. The inner and outer diameters of the sleeve element are 15.5 cm and 20 cm respectively. Hence, the diameter of one doping element is smaller than one twentieth of the diameter of the conductor element.

As the assembly in FIG. 1a and the conductor and doping elements in FIGS. 1b-c the conductor element 41 comprises a core of Nb, and the doping elements 43 each comprises a core of NbTi. The sizes of the conductor element and doping elements are selected so that the finished superconductor will contain Ti in the range between 0.2-3% by weight. The assembly further comprises an Sn-source 47, wherein the finished superconductor filament will comprise $Nb_3Sn$ doped with between 0.2-3% by weight of Ti. The assembly further comprises a supporting element 49 of Cu or a Cu-alloy surrounding and supporting the subassemblies 37 and the Sn-source 47 arranged in the center of the assembly.

A finished superconductor is formed from the metal assembly by processing the assembly in accordance with the method described below.

In the following a method suitable for forming a superconductor will be disclosed. The method comprises forming a metal assembly in accordance with the assembly in FIG. 2a, and then processing the assembly.

In a first step 51, the method comprises producing the doping elements 43 (same as doping element 7 in FIG. 1c) and conductor elements 41 by elongating a material blank of the respective materials, corresponding to the first step in relation to FIG. 1c. The method also comprises arranging a diffusion-blocking layer around doping cores and optionally around the conductor cores, wherein a doping casing is arranged around each core and diffusion-blocking layer. The doping elements 43 are in this example drawn to a diameter of 5 mm, while the conductor elements 41 are metal worked to a diameter of 15 cm.

In a second step 53, the method comprises arranging between one and seven conductor elements, in this example only one conductor element 41, and its neighbouring doping elements 43 inside a sleeve element 39 to form a subassembly 37. The sleeve element 39 is shaped as a cylinder having a cylinder wall 45 defining a hollow space, and the method comprises positioning the conductor element in the middle of the hollow space. The method also comprises positioning four doping elements 43 in the space between the conductor element 41 and the wall 45 of the cylinder inside the hollow. Hence the doping elements 43 are positioned next to and in contact with the conductor element 41. In this example the method also comprises positioning the doping elements 43 in four different directions of the conductor element, in this example substantially uniformly around the conductor element. In another embodiment of this invention, doping element comprising binary NbTi alloy elements, round or rectangular in shape, are assembled into similar configuration with elements 43. Between doping elements and the hollow cylinder 39, a diffusion blocking sleeve of pure niobium is assembled to form subassembly 37. This diffusion barrier is to block diffusion of Ti and copper to form hard adverse CuTi particles during possible hot forming steps.

In a third step 55, the method comprises compacting the subassembly 37. By compacting the subassembly 37 the spaces formed in between the different elements in the assembly, such as between the sleeve element 39, the doping elements 43, and the conductor elements 41, and also between different subassemblies 37, will be decreased. These spaces might otherwise introduce trapped gas, such as air, inside the finished superconductor. In this example the method comprises compacting the metal assembly by HIP-treating (Hot Isostatic Pressing) the subassembly.

In a fourth step 59 the method comprises elongating the subassembly 37 in FIG. 2a. The subassembly 37 may be elongated by for example extrusion, drawing, or some other suitable method. If both extrusion and drawing is applied, extrusion is performed prior to drawing.

In a 5th step 61 the method comprises arranging a plurality of subassemblies 37 into a metal assembly 35. The method also comprises arranging a Sn-source 47 into the metal assembly 35. The Sn-source is arranged into the metal assembly 35 in a step after any intermediate hot temperature treatments, since Sn has a low melting point and would tend to diffuse and react prematurely. The Sn-source 47 is furthermore preferably pure Sn or a SnCu-alloy. Due to the low melting point of Sn in comparison with other metals any inclusions of other elements inside the Sn-source may otherwise precipitate and form hard particles or grains in the Sn-source. Since the desired diameters of the finished metal assembly 35 is small (cf. step seven below) such particles or grains may disrupt the filaments of the superconductor.

In a 6th step 63 the method comprises elongating the metal assembly 35. The elongation may comprise rolling, but comprises preferably drawing, since drawing gives the smallest changes to the material of the metal assembly 35. Due to the presence of Sn, the metal assembly 35 is cold drawn. According to one example of the invention, several such drawn metal assemblies 35 are then arranged inside a second sleeve element to form a second metal assembly. The second metal assembly is drawn even further, and this process is repeated until a final desired shape and diameter is reached. In another embodiment of this invention, at final restacking step of the metal assembly 35, a diffusion blocking sleeve of Ta, Nb or Nb alloy is introduced between the subassemblies 37 and the hollow copper sleeve 47 to protect copper from contaminating during diffusion annealing treatment. The final metal assembly may then contain several sets of subassemblies, arranged one within the other. Hence, the metal assembly 35 is elongated into a final diameter desired for the finished superconductor. Prior to a final forming step the conductor elements, the Nb filaments are twisted into a helical path in a separate twisting operation. The desired shape depends on the application, but it is usually a round or rectangular wire shape, wherein a superconducting filaments of Nb3Sn will be produced. The diameter of the wire is typically between 0.3-2 mm, and the diameter of the superconducting Nb3Sn filaments is usually between 2-15 µm. In another alternative embodiment a plurality of final size wires 35 can be twisted to form a cable structure before reaction annealing treatment. Typically, wires will be coated with chromium, nickel or their alloys before cabling operation.

In an 7th step 65 the method comprises diffusion annealing the final superconducting wire by heat-treating the plurality of drawn metal assemblies 35, in order to produce a finished superconductor 35. In this example the method comprises diffusion annealing by heat-treating the final metal assembly in between 500-1000° C. for between 50-400 hours. During the diffusion annealing heat treatment the Ti in the doping elements diffuse into the Nb-filaments made from the conductor elements, and the Sn from the Sn-source also diffuse into the Nb-filaments, so that superconductor filaments of $Nb_3Sn$ doped with Ti, are formed. Hence the metal assembly will now constitute a finished superconductor.

Figure 3:
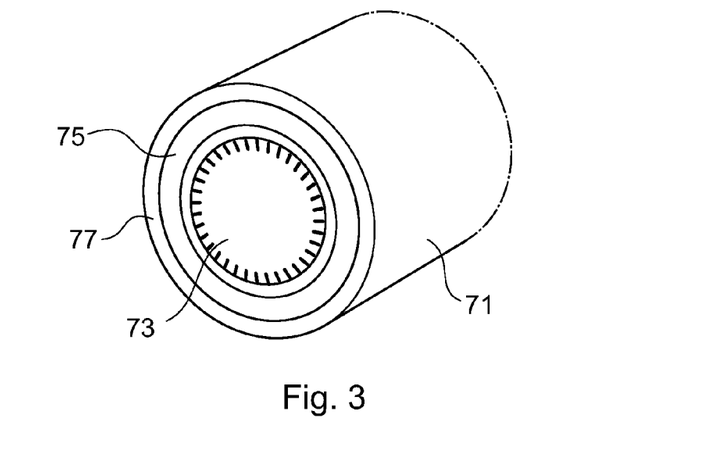
FIG. 3 shows an example of a metal assembly.

In FIG. 3 a third example of a metal assembly 71 is shown. The metal assembly in FIG. 3 may also be used as a subassembly, by arranging several such assemblies into a larger assembly. The metal assembly 71 in FIG. 3 comprises a conductor element 73 arranged in the middle, and a cylindrical, hollow doping element 75 arranged around the conductor element. Hence the conductor element is arranged inside the hollow doping element 75, so that the doping element is arranged outside and uniformly around the conductor element. Hence the doping substance will easily diffuse into the conductor element homogenously during a diffusion step for uniform doping of the conductor element. The assembly further comprises a cylindrical, hollow copper sleeve 77 arranged around the doping element. In another embodiment of this invention, a diffusion blocking sleeve Nb is introduced between the hollow doping element 75 and a hollow copper sleeve 77.

The invention is not limited to the embodiments shown, but may be varied within the framework of the appended claims. In particular, the different embodiments may be mixed with each other to form variations of the invention. The number of conductor and doping elements may be varied, as long as the number of doping elements exceed or equals the number of conductor elements, and the number of subassemblies, or number of subassemblies within subassemblies, may also be varied freely. Furthermore, the shape of the different elements and assemblies may also be varied depending on the desired application for the superconductor.

The invention claimed is:

1. A metal assembly precursor for a superconductor, comprising:
    at least one conductor element adapted to provide a superconducting filament in the finished superconductor, each at least one conductor element configured as a rod;
    at least one doping element providing a doping source for doping the conductor element, each at least one doping element configured as a rod, the at least one doping element rod being distinct from the at least one conductor element rod;
    a sleeve element made of Cu or a Cu-alloy arranged outside the conductor element and the doping element; and
    a Sn-source;
    wherein the conductor elements comprise a conductor core containing Nb and possible impurities, the doping elements comprising a doping core comprising a NbTi-alloy with a Ti content between 20-60% by weight, and a doping element casing made of Cu or a Cu-alloy;
    wherein the assembly comprises at least as many doping elements arranged outside the conductor elements as the number of conductor elements;
    wherein the doping elements comprise a diffusion-blocking layer arranged as a coating on the doping core and adapter to block the diffusion of the doping substance at temperatures below a desired diffusion temperature;
    wherein the doping element casing is arranged around the core and the diffusion-blocking layer.

2. An assembly according to claim 1, wherein the NbTi-alloy has has a Ti content between 40-50% by weight and a balance of Nb and possible residual impurities.

3. An assembly according to claim 1, wherein, for at least a majority of the conductor elements, at least one doping element is positioned next to each conductor element.

4. An assembly according to claim 3, wherein, for at least a majority of the conductor elements, at least two doping elements are positioned next to, and in two different directions of, each conductor element.

5. An assembly according to claim 1, wherein, for at least a majority of the sleeve elements, each sleeve element has a wall defining an inner hollow, and that the doping element or elements contained inside the sleeve are positioned between the wall of the sleeve and the conductor element or elements contained in the sleeve.

6. An assembly according to the claim 5, wherein the assembly comprises at least three doping elements spaced around each conductor element inside the sleeve element.

7. An assembly according to claim 1, wherein at least a majority of the conductor elements and doping elements have an elongated shape with a uniform cross-section, and that the majority of the doping elements each have a cross-sectional area smaller than or equal to one fifth of the cross-sectional area of the closest conductor element.

8. A method for producing a superconductor, the method comprising:
    assembling at least one conductor element and at least one doping element, a sleeve element made of Cu or a CU-alloy, and a Sn-source into a metal assembly constituting a precursor for a superconductor; and
    assembling at least four doping element for each conductor element into the metal assembly, and arranging the doping elements outside the conductor elements;
    wherein the conductor elements comprise a conductor core containing Nb and possible impurities, the doping elements comprising a doping core comprising a NbTi-alloy with a Ti content between 20-60% by weight, and a doping element casing made of Cu or a Cu-alloy;
    wherein the assembly comprises at least as many doping elements arranged outside the conductor elements as the number of conductor elements;
    wherein the doping elements comprise a diffusion-blocking layer arranged as a coating on the doping core and adapter to block the diffusion of the doping substance at temperatures below a desired diffusion temperature;
    wherein the doping element casing is arranged around the core and the diffusion-blocking layer.

9. A method according to claim 8, further comprising positioning at least one doping element next to each conductor element for at least a majority of the conductor elements.

10. A method according to claim 9, further comprising positioning at least a majority of the doping elements next to each conductor element at a distance from the conductor element which is smaller than or equal to the diameter of the conductor element.

11. A method according to claim 8, further comprising elongating the doping element or elements so that each doping element obtain a cross-sectional area which is smaller than one fifth of the cross-sectional area of the closest conductor element.

12. A method according to claim 8, further comprising:
    arranging between one and seven conductor elements and its or their neighbouring doping element or elements inside the sleeve element; and
    assembling a plurality of such sleeve elements into a metal assembly precursor for a superconductor.

13. A method according to claim 12, wherein, for at least a majority of the sleeve elements, each sleeve element comprises a wall defining a hollow space, wherein the method comprises positioning at least a majority of the doping element or elements contained in the sleeve element between the wall of the sleeve element and the conductor element or elements contained in the sleeve element.

* * * * *

UNITED STATES PATENT AND TRADEMARK OFFICE
CERTIFICATE OF CORRECTION

PATENT NO.         : 8,626,254 B2                                               Page 1 of 1
APPLICATION NO. : 13/141119
DATED              : January 7, 2014
INVENTOR(S)        : Jukka Somerkoski It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 223 days.

Signed and Sealed this

Twenty-second Day of September, 2015

Michelle K. Lee
*Director of the United States Patent and Trademark Office*